(12) United States Patent
Hecht

(10) Patent No.: US 7,388,433 B1
(45) Date of Patent: Jun. 17, 2008

(54) GROUND INDUCTANCE COMPENSATED QUADRATURE RADIO FREQUENCY AMPLIFIER

(75) Inventor: James Burr Hecht, Cedar Rapids, IA (US)

(73) Assignee: RF Micro Devices, Inc., Greensboro, NC (US)

( * ) Notice: Subject to any disclaimer, the term of this patent is extended or adjusted under 35 U.S.C. 154(b) by 70 days.

(21) Appl. No.: 11/471,836

(22) Filed: Jun. 21, 2006

(51) Int. Cl.
*H03F 3/68* (2006.01)

(52) U.S. Cl. .................................. 330/295; 330/124 R

(58) Field of Classification Search ............... 330/295, 330/124 R, 84, 126
See application file for complete search history.

(56) References Cited

U.S. PATENT DOCUMENTS

| | | | |
|---|---|---|---|
| 4,916,410 A * | 4/1990 | Littlefield | 330/295 |
| 6,650,180 B2 * | 11/2003 | Lautzenhiser et al. | 330/124 R |
| 7,256,650 B1 * | 8/2007 | Stockert | 330/124 R |

* cited by examiner

*Primary Examiner*—Henry K Choe
(74) *Attorney, Agent, or Firm*—Withrow & Terranova, PLLC

(57) ABSTRACT

The present invention is a quadrature RF amplifier including an in-phase amplifier leg and a quadrature-phase amplifier leg. The nominal gain of the in-phase amplifier leg is substantially different from the nominal gain of the quadrature-phase amplifier leg to compensate for gain imbalances introduced by the ground currents of both amplifier legs sharing a common ground lead. The gain imbalances are as a result of voltages developed across the inductance of the common ground lead. Since it is possible to completely compensate for the gain imbalances, reducing the inductance of the common ground lead may be unnecessary.

15 Claims, 6 Drawing Sheets

GROUND INDUCTANCE COMPENSATED QUADRATURE RADIO FREQUENCY AMPLIFIER

FIELD OF THE INVENTION

The present invention relates to Radio Frequency (RF) power amplifiers used in RF communications circuitry.

BACKGROUND OF THE INVENTION

Gain, direct current (DC) current, and adjacent channel power (ACP) of an RF power amplifier are functions of the load impedance seen at the output of the power amplifier. Ideally, the load impedance is a constant load; however, in reality, the load impedance may change due to variations in the impedance of the components in the transmit chain following the power amplifier, such as a duplexer, caused by frequency, temperature, and process variations. Load impedance may also vary due to variations in impedance of an antenna of a mobile device caused by proximity of the antenna to foreign metallic objects and a user's body. As a result, RF power amplifier architectures that tend to minimize gain, DC current, and ACP variations due to changes in load impedance are commonly used. Once such architecture is a quadrature RF power amplifier.

The stability of a quadrature RF power amplifier's performance is not as susceptible to output load variations as other RF power amplifier architectures. A quadrature RF power amplifier splits and phase shifts an RF input signal into two quadrature RF signals that are 90 degrees out of phase with each other. The two quadrature RF signals are then amplified, phase shifted back into phase with each other, and then combined to form an RF output signal. The quadrature power amplifier minimizes performance variations by presenting each side of the amplifier with a load that is out of phase with the other side of the amplifier. When one side of the amplifier is presented with a load that causes low gain, the other side is being presented with a load that causes high gain. This is in contrast to a single-ended amplifier in which the amplifier stage is presented with a single load. Hence, the quadrature architecture provides a method of diversifying the load presented to the power amplifier. This diversification results in higher immunity to performance variation resulting from a high voltage standing wave ratio (VSWR) at the power amplifier's output. It is important that the amplitudes of both sides of the power amplifier are closely matched and the 90 degree phase-shift is maintained for proper operation.

Quadrature RF power amplifiers are often constructed into power amplifier modules, which may include a die and a frame. The die may have a common ground connection, such as the backside of the die, which is coupled to elements in the frame, such as a ground flag. This coupling introduces a common inductance through which ground currents from both sides of the power amplifier must flow. This common inductance introduces a feedback path, which produces an imbalance in the amplitude and phase relationship between the two sides of the power amplifier. Thus, there is a need to compensate for the common ground inductance and restore equal amplitude and 90 degree separation to the two sides of the power amplifier.

SUMMARY OF THE INVENTION

The present invention is a quadrature RF amplifier including an in-phase amplifier leg and a quadrature-phase amplifier leg. The nominal gain of the in-phase amplifier leg is substantially different from the nominal gain of the quadrature-phase amplifier leg to compensate for gain imbalances introduced by the ground currents of both amplifier legs sharing a common ground lead. The gain imbalances are a result of voltages developed across the inductance of the common ground lead. Since it is possible to completely compensate for the gain imbalances, reducing the inductance of the common ground lead may be unnecessary.

In normal operation, as a result of the compensating effects of the nominal gain imbalance, the operating gains of the in-phase amplifier leg and the quadrature-phase amplifier leg are substantially equal and the output of the quadrature-phase leg is phase-shifted approximately 90 degrees from the output of the in-phase amplifier leg. The nominal gains are determined by the values of gain setting components in the quadrature RF amplifier. The values of the gain setting components of the in-phase amplifier leg are different from the values of the gain setting components of the quadrature-phase amplifier leg.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIG. 1 shows one embodiment of the present invention in a quadrature RF power amplifier circuit.

FIG. 2 adds feedback resistors to the quadrature RF power amplifier circuit of FIG. 1, and shows separate ground connections for the two amplifier legs. This configuration is used to determine nominal gains.

DETAILED DESCRIPTION OF THE PREFERRED EMBODIMENTS

Figure 1:
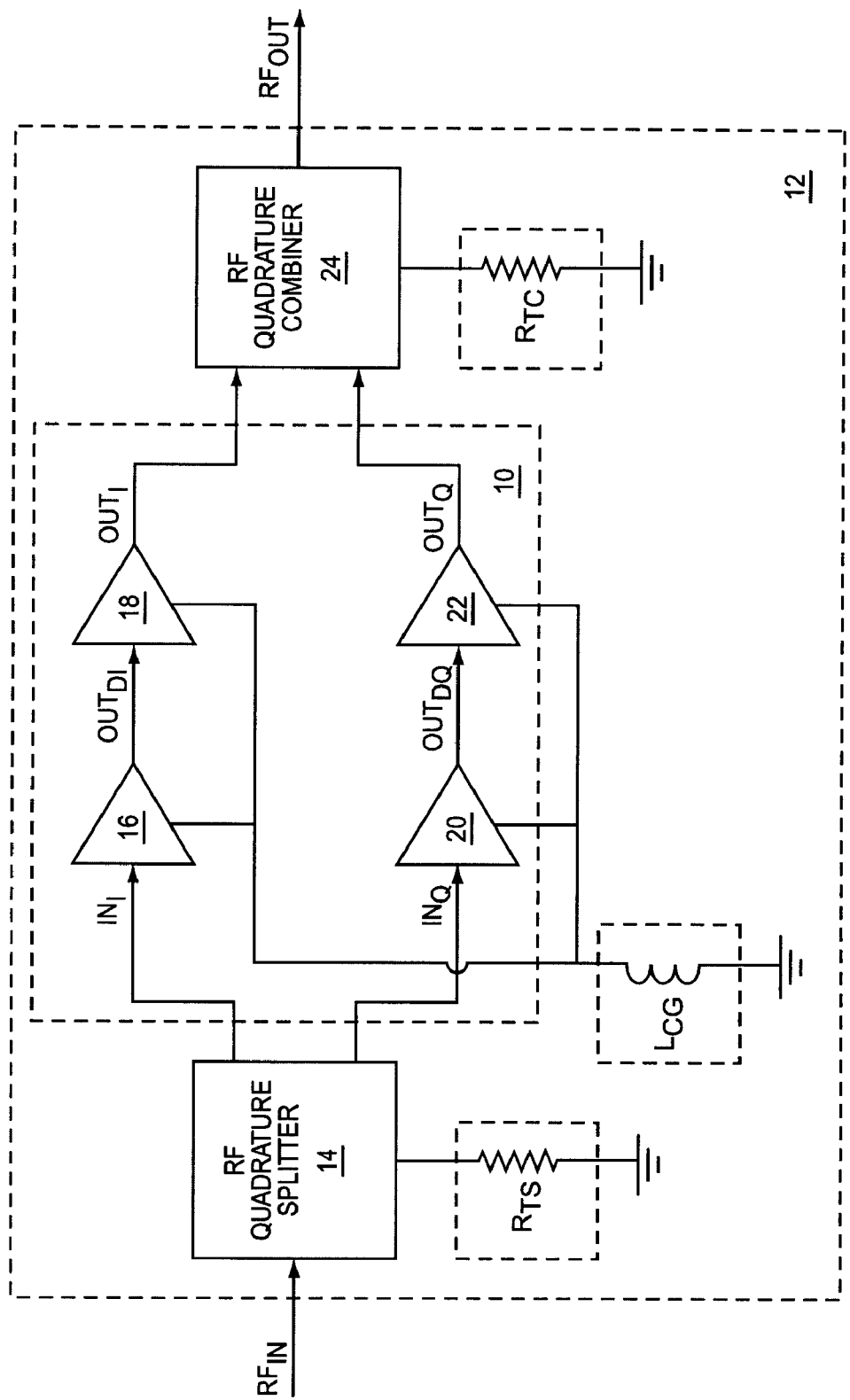

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

One embodiment of the present invention is a quadrature RF amplifier including an in-phase amplifier leg and a quadrature-phase amplifier leg. A nominal gain of the in-phase amplifier leg is substantially different from a nominal gain of the quadrature-phase amplifier leg to compensate for gain imbalances introduced by ground currents of both amplifier legs sharing a common ground lead. The gain imbalances are a result of voltages developed across an inductance of the common ground lead. Since it is possible to completely compensate for the gain imbalances, reducing the inductance of the common ground lead may be unnecessary.

In normal operation, as a result of the compensating effects of the nominal gain imbalance, operating gains of the in-phase amplifier leg and the quadrature-phase amplifier leg are substantially equal and the quadrature-phase leg is phase-shifted approximately 90 degrees from the in-phase amplifier leg. The nominal gains are determined by values of gain setting components in the quadrature RF amplifier. The values of the gain setting components of the in-phase amplifier leg are different from the values of the gain setting components of the quadrature-phase amplifier leg.

One embodiment of the present invention has a nominal in-phase voltage gain $GAIN_{NOMI}$, a nominal quadrature-phase voltage gain $GAIN_{NOMQ}$, an operating in-phase voltage gain $GAIN_{OPI}$, and an operating quadrature-phase voltage gain $GAIN_{OPQ}$. The nominal voltage gains $GAIN_{NOMI}$, $GAIN_{NOMQ}$ are determined by in-phase gain setting components and quadrature-phase gain setting components, respectively, and are calculated excluding any effects that one amplifier leg would have on the gain of the other amplifier leg due to any mutual coupling between the amplifier legs. The operating voltage gains $GAIN_{OPI}$, $GAIN_{OPQ}$ are determined by actual circuit operation and include the effects of gain setting components and other circuit elements, such as common ground lead inductances. The nominal in-phase voltage gain $GAIN_{NOMI}$ is equal to an amplitude of a nominal in-phase output signal $OUT_{NOMI}$ divided by an amplitude of an in-phase input signal INS, and the nominal quadrature-phase voltage gain $GAIN_{NOMQ}$ is equal to an amplitude of a nominal quadrature-phase output signal $OUT_{NOMQ}$ divided by an amplitude of a quadrature-phase input signal $IN_Q$. The nominal voltage gains $GAIN_{NOMI}$, $GAIN_{NOMQ}$ are gains that would be developed as a result of only the gain setting components, and exclude any effects of mutual coupling between the amplifier legs. The operating in-phase voltage gain $GAIN_{OPI}$ is equal to an amplitude of an in-phase output signal $OUT_I$, divided by the amplitude of the in-phase input signal $IN_I$, and the operating quadrature-phase voltage gain $GAIN_{OPQ}$ is equal to an amplitude of a quadrature-phase output signal $OUT_Q$ divided by the amplitude of the quadrature-phase input signal $IN_Q$.

Some traditional quadrature RF amplifier designs may be based on the assumption that by making the nominal in-phase voltage gain $GAIN_{NOMI}$ equal to the nominal quadrature-phase voltage gain $GAIN_{NOMQ}$, then the operating in-phase voltage gain $GAIN_{OPI}$ will be equal to the operating quadrature-phase voltage gain $GAIN_{OPQ}$. However, if an in-phase amplifier leg and a quadrature-phase amplifier leg share a common ground lead with a common ground inductance, the operating voltage gains $GAIN_{OPI}$, $GAIN_{OPQ}$ will not be equal. In one embodiment of the present invention, the nominal voltage gains $GAIN_{NOMI}$, $GAIN_{NOMQ}$ are deliberately made unequal to make the operating voltage gains $GAIN_{OPI}$, $GAIN_{OPQ}$ equal.

Figure 6:
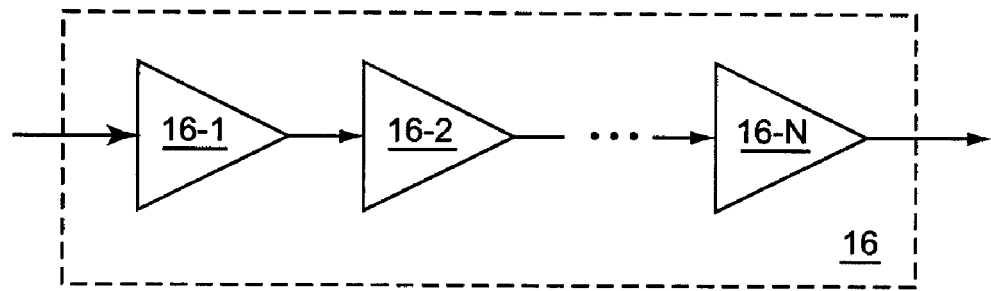
FIG. 6 shows an exemplary embodiment of the in-phase driver circuit of FIGS. 1 and 2 including a number of driver stages.
Figure 7:
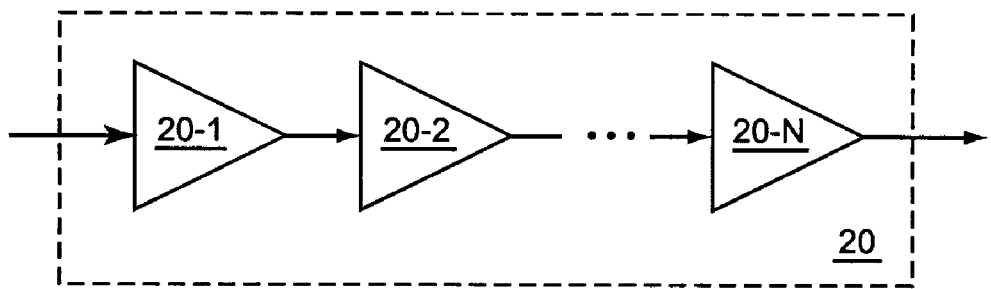
FIG. 7 shows an exemplary embodiment of the quadrature-phase driver circuit of FIGS. 1 and 2 including a number of driver stages.

One embodiment of the present invention is a quadrature RF power amplifier 10 used in a quadrature RF power amplifier circuit 12 as shown in FIG. 1. An RF quadrature splitter 14 receives an RF input signal $RF_{IN}$, which is split and phase-shifted into the in-phase input signal $IN_I$ and the quadrature-phase input signal $IN_Q$. The input signals $IN_I$, $IN_Q$ are substantially equal in amplitude and phase-shifted approximately 90 degrees. The quadrature RF power amplifier 10 includes an in-phase driver circuit 16, which receives $IN_I$ and provides an amplified in-phase driver output signal $OUT_{DI}$ to an in-phase final stage 18. As illustrated in FIG. 6, the in-phase driver circuit 16 may include any number of one or more driver stages 16-1 through 16-N. A quadrature-phase driver circuit 20 receives $IN_Q$, and provides an amplified quadrature-phase driver output signal $OUT_{DQ}$ to a quadrature-phase final stage 22. As illustrated in FIG. 7, the quadrature-phase driver circuit 20 may include any number of one or more driver stages 20-1 through 20-N. The in-phase final stage 18 amplifies $OUT_{DI}$ and provides the in-phase output signal $OUT_I$ to an RF quadrature combiner 24. The quadrature-phase final stage 22 amplifies $OUT_{DQ}$ and provides the quadrature-phase output signal $OUT_Q$ to the RF quadrature combiner 24, which phase-shifts and combines the quadrature output signals $OUT_I$, $OUT_Q$ to provide an RF output signal $RF_{OUT}$.

An RF quadrature coupler may be used to form the RF quadrature splitter 14 and the RF quadrature combiner 24. The RF quadrature coupler may include a termination port, which is connected to a termination resistor. Any unbalanced or phase-mismatched signals are reflected to the termination port for termination; therefore, amplitude imbalances, phase imbalances, or both, in the quadrature RF power amplifier 10 will cause excess power consumption. A termination port on the RF quadrature splitter 14 is coupled to a splitter termination resistor $R_{TS}$. A termination port on the RF quadrature combiner 24 is coupled to a combiner termination resistor $R_{TC}$. If the driver circuits 16, 20 and the final stages 18, 22 were each connected to ground individually, a total emitter inductance of each stage could be represented as $L_e$. The total emitter inductance would include an inductance of the emitter circuitry and an inductance of the ground lead. The inductance of the ground lead could contribute half of the total emitter inductance, or $$\frac{L_e}{2}.$$

If the driver circuits 16, 20 and the final stages 18, 22 all share a common ground lead $L_{CG}$, which is shown as an inductor, the common ground inductance could be one fourth of the inductance of an individual ground lead, since the four ground leads are essentially connected in parallel. Therefore, the common ground lead $L_{CG}$, could have a common ground inductance of $$\frac{L_e}{8}.$$

It is the combined ground currents passing through the common ground lead $L_{CG}$ that cause imbalance in the quadrature RF power amplifier 10.

Figure 2:
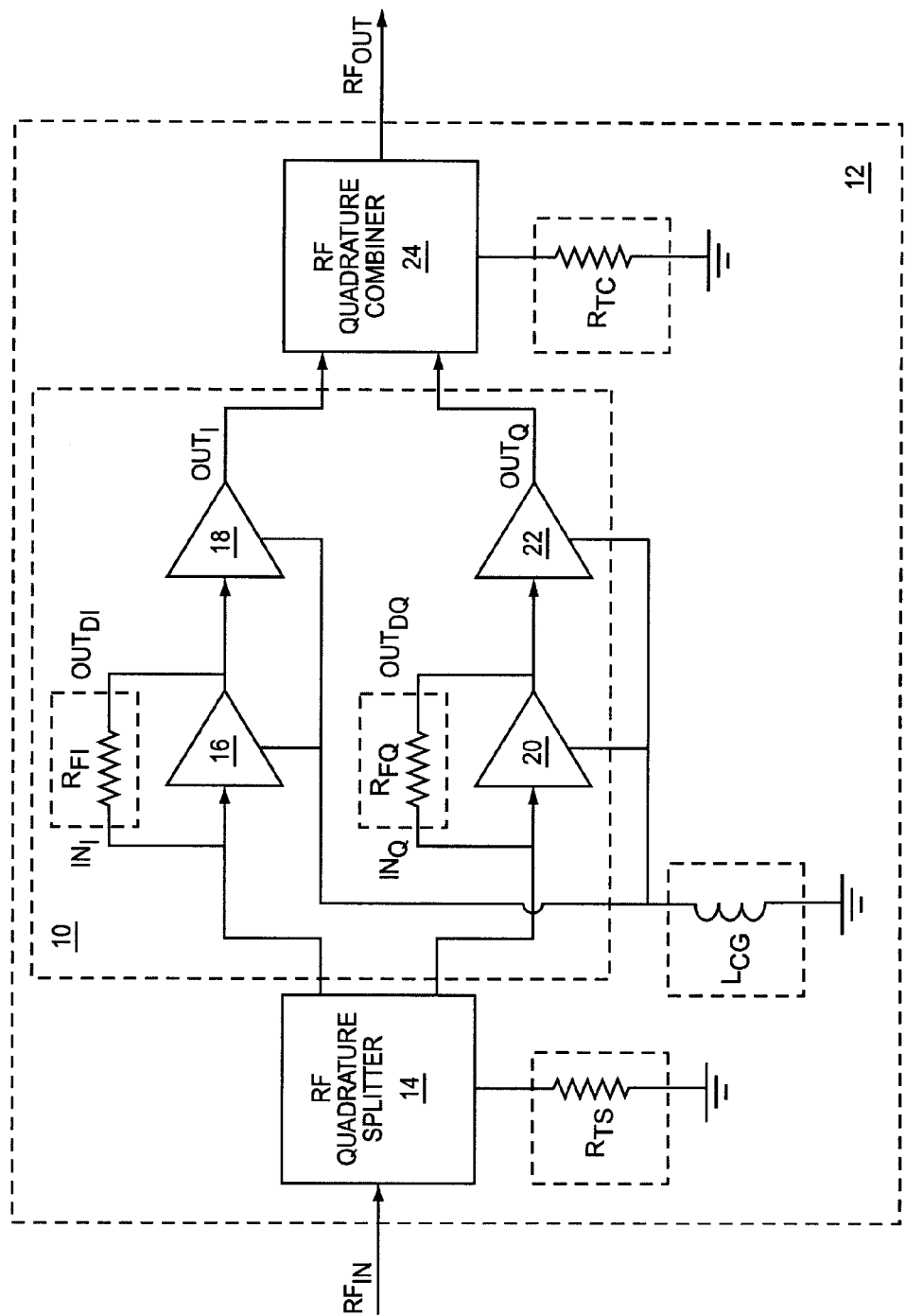

FIG. 2 shows a configuration of the quadrature RF power amplifier circuit 12, which may not be practical in operation, but is useful in determining nominal voltage gains $GAIN_{NOMI}$, $GAIN_{NOMQ}$. An in-phase feedback resistor $R_{FI}$ and a quadrature-phase feedback resistor $R_{FQ}$ are added to the quadrature RF power amplifier 10. The in-phase feedback resistor $R_{FI}$ is coupled between an input and an output of the in-phase driver circuit 16. The quadrature-phase feedback resistor $R_{FQ}$ is coupled between an input and an output of the quadrature-phase driver circuit 20. The common ground lead $L_{CG}$ may alternatively be represented by an in-phase common ground lead $L_{CGI}$ and a quadrature-phase common ground lead $L_{CGQ}$, each of which may have a common ground inductance of $$\frac{Le}{4}.$$

Both feedback resistors $R_{FI}$, $R_{FQ}$ and both common ground leads $L_{CGI}$, $L_{CGQ}$ influence the nominal voltage gains $GAIN_{NOMI}$, $GAIN_{NOMQ}$.

Figure 3:
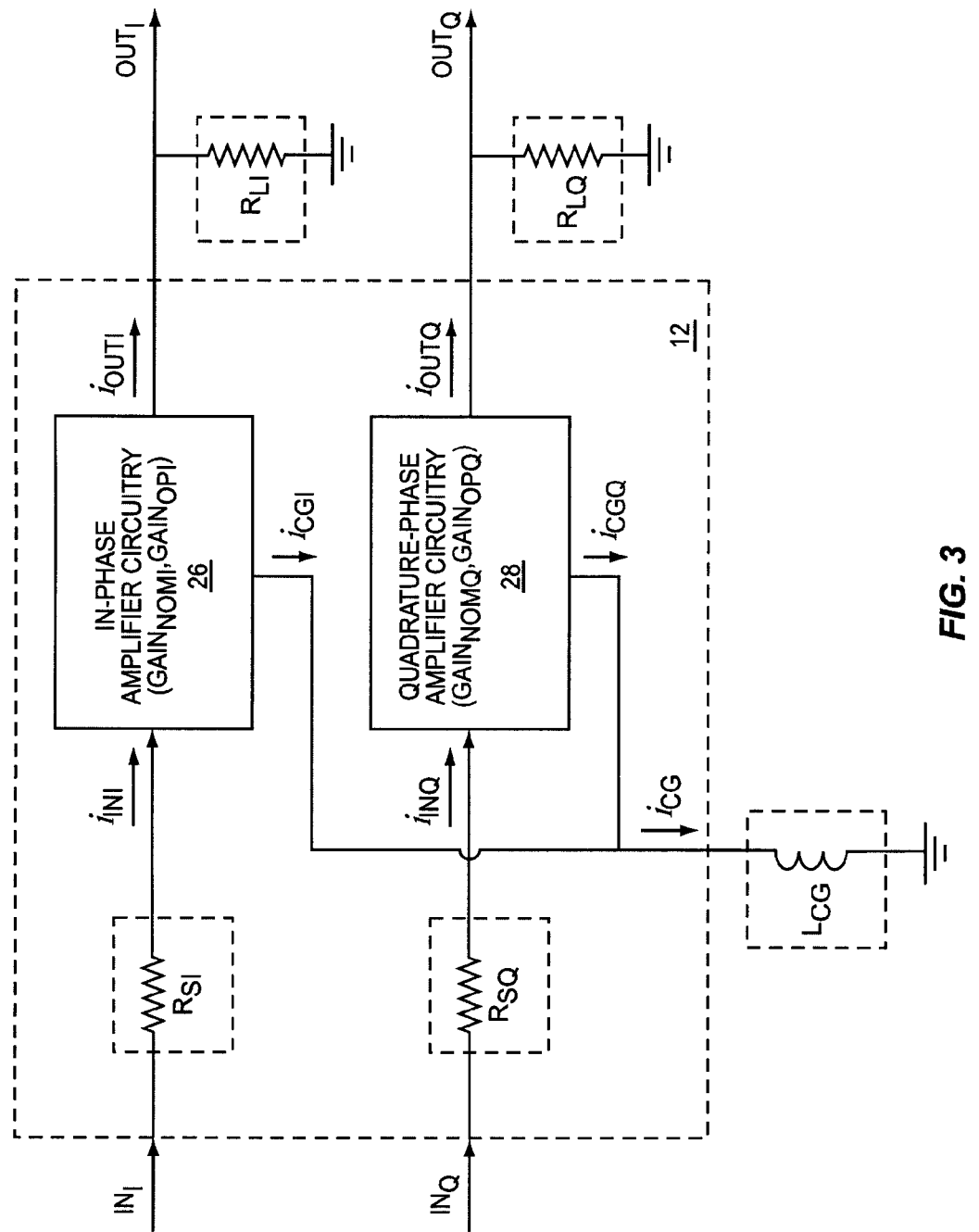
FIG. 3 shows details of the quadrature RF power amplifier of FIG. 1.

In one embodiment of the present invention, the quadrature RF power amplifier 10 includes in-phase amplifier circuitry 26 and quadrature-phase amplifier circuitry 28, as shown in FIG. 3. The in-phase amplifier circuitry 26 receives the in-phase input signal $IN_I$ through an in-phase gain resistor $R_{SI}$, which has an in-phase gain resistance $R_{si}$. The quadrature-phase amplifier circuitry 28 receives the quadrature-phase input signal $IN_Q$ through a quadrature-phase gain resistor $R_{SQ}$, which has a quadrature-phase gain resistance $R_{SQ}$. The in-phase amplifier circuitry 26 receives an in-phase input current $i_{INI}$ through the in-phase gain resistor $R_{SI}$. The quadrature-phase amplifier circuitry 28 receives a quadrature-phase input current $i_{INQ}$ through the quadrature-phase gain resistor $R_{SQ}$. An output of the in-phase amplifier circuitry 26 provides the in-phase output signal $OUT_I$ and is coupled to an in-phase load resistor $R_{LI}$, which has an in-phase load resistance $R_{li}$. An in-phase output current $i_{OUTI}$ is provided from the in-phase amplifier circuitry 26. An output of the quadrature-phase amplifier circuitry 28 provides the quadrature-phase output signal $OUT_Q$ and is coupled to a quadrature-phase load resistor $R_{LQ}$, which has a quadrature-phase load resistance $R_{lq}$. A quadrature-phase output current $i_{OUTQ}$ is provided from the quadrature-phase amplifier circuitry 28. The in-phase amplifier circuitry 26 amplifies $IN_I$ to create the in-phase output signal $OUT_I$ and the quadrature-phase amplifier circuitry 28 amplifies $IN_Q$ to create the quadrature-phase output signal $OUT_Q$. An in-phase common ground current $i_{CGI}$ flows through a ground connection of the in-phase amplifier circuitry 26. A quadrature-phase common ground current $i_{CGQ}$ flows through a ground connection of the quadrature-phase amplifier circuitry 28. The ground connections of the in-phase and quadrature-phase amplifier circuitry 26, 28 are connected to the common ground lead $L_{CG}$. The in-phase and quadrature-phase common ground currents $i_{CGI}$, $i_{CGQ}$ combine to form a common ground current $i_{CG}$.

Figure 4:
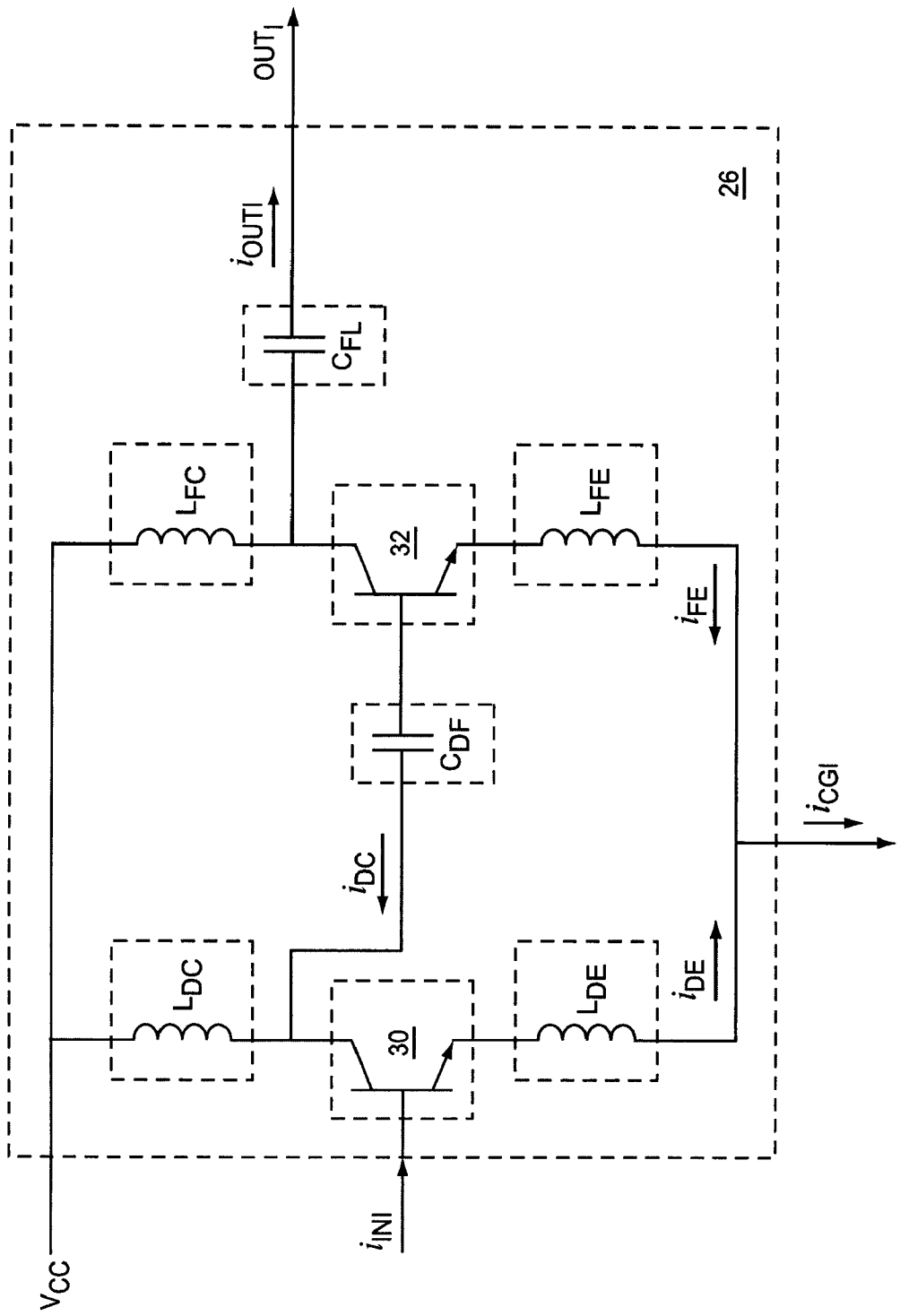
FIG. 4 shows details of the in-phase amplifier circuitry of FIG. 3.

Details of the in-phase amplifier circuitry 26 are shown in FIG. 4. DC bias circuitry has been removed for simplicity. The currents shown are alternating current (AC) currents. The in-phase input current $i_{INI}$ feeds the base of a driver transistor 30. The collector of the driver transistor 30 drives the final stage through a driver-to-final coupling capacitor $C_{DF}$, which feeds the base of a final transistor 32. The collector of the final transistor 32 provides the in-phase output current $i_{OUTI}$ through a final-to-load coupling capacitor $C_{FL}$. The collector of the driver transistor 30 is fed from a DC supply voltage $V_{CC}$ through a driver collector inductor $L_{DC}$. The collector of the final transistor 32 is fed from the DC supply voltage $V_{CC}$ through a final collector inductor $L_{FC}$. The emitter of the driver transistor 30 is coupled to a common ground connection through a driver emitter lead $L_{DE}$, which has an emitter inductance $$\frac{Le}{2}.$$

The emitter of the final transistor 32 is coupled to the common ground connection through a final emitter lead $L_{FE}$, which has an emitter inductance $$\frac{Le}{2}.$$

The inductances of the collector inductors $L_{DC}$, $L_{FC}$ are large values such that only negligible AC currents flow in the collector inductors $L_{DC}$, $L_{FC}$. The capacitances of the coupling capacitors $C_{DF}$, $C_{FL}$ are large values such that only negligible DC voltages are developed across the coupling capacitors $C_{DF}$, $C_{FL}$. The transistors 30, 32 have the same value of AC current gain $\beta$ and the same value of AC base-to-emitter resistance $R_{in}$. Driver collector current $i_{DC}$ to the driver transistor 30 provides the base current to the final transistor 32. Driver emitter current $i_{DE}$ from the driver transistor 30 and final emitter current $i_{FE}$ from the final transistor 32 combine to provide the in-phase common ground current $i_{CGI}$.

The following equations show the relationship between the in-phase input current $i_{INI}$ and the in-phase output current $i_{OUTI}$, and between the in-phase input current $i_{INI}$ and the in-phase common ground current $i_{CGI}$:

$$i_{DC} = \beta i_{INI} \quad \text{EQ. 1}$$

$$i_{OUTI} = -\beta(-i_{DC}) = \beta(\beta i_{INI}) = \beta^2 i_{INI} \quad \text{EQ. 2}$$

$$i_{CGI} = i_{DE} + i_{FE} = (1+\beta)i_{INI} + (1+\beta)(-\beta i_{INI}) = (1-\beta^2)i_{INI} \quad \text{EQ. 3}$$

Returning to FIG. 3, the quadrature-phase amplifier circuitry 28 is identical to the in-phase amplifier circuitry 26; therefore, the relationships shown in EQ. 2 and EQ. 3 are transferable as shown below:

$$i_{OUTQ} = \beta^2 i_{INQ} \quad \text{EQ. 5}$$

$$i_{CGQ} = (1-\beta^2)i_{INQ} \quad \text{EQ. 6}$$

The amplitudes of the in-phase output signal $OUT_I$ and the quadrature-phase output signal $OUT_Q$ are given by:

$$OUT_I = i_{OUTI} R_{li} \quad \text{EQ. 7}$$

$$OUT_Q = i_{OUTQ} R_{lq} \quad \text{EQ. 8}$$

For proper quadrature operation of the quadrature RF amplifier 10, $OUT_Q$ must have the same amplitude as $OUT_I$ and must be phase-shifted from $OUT_I$ by approximately 90 degrees; therefore, if $R_{li} = R_{lq}$, then $i_{OUTQ}$ must have the same amplitude as $i_{OUTI}$ and must be phase-shifted from $i_{OUTI}$ by approximately 90 degrees, which can be represented mathematically as:

$$i_{OUTQ} = j i_{OUTI} \text{ then substituting into EQ. 5 gives,} \quad \text{EQ. 9}$$

$$i_{OUTQ} = \beta^2 i_{INQ} = j i_{OUTI} \text{ then substituting into EQ. 2 gives,} \quad \text{EQ. 10}$$

$$i_{OUTI} = \beta^2 i_{INI} \text{ or } j i_{OUTI} = j\beta^2 i_{INI} = \beta^2 i_{INQ} \text{ or } i_{INQ} = j i_{INI} \quad \text{EQ. 11}$$

By substituting EQ. 11 into EQ. 5 and EQ. 6, the quadrature-phase output current $i_{OUTQ}$ and the quadrature-phase common ground current $i_{CGQ}$ can be represented in terms of the in-phase input current $i_{INI}$ as shown below:

$$i_{OUTQ} = j\beta^2 i_{INI} \qquad \text{EQ. 12}$$

$$i_{CGQ} = j(1-\beta^2) i_{INI} \qquad \text{EQ. 13}$$

The common ground current $i_{CG}$ is equal to the sum of the in-phase and quadrature-phase common ground currents $i_{CGI}$, $i_{CGQ}$, or $$i_{CG} = i_{CGI} + i_{CGQ} = (1+j)(1-\beta^2) i_{INI} \qquad \text{EQ. 14}$$

With the circuit currents identified, equations for the quadrature input signals $IN_I$, $IN_Q$ can be developed by summing the voltage drops across the series circuit elements.

The nominal voltage gains are calculated excluding any effects that one amplifier leg would have on the gain of the other amplifier leg due to any mutual coupling between the amplifier legs. To determine nominal voltage gains $GAIN_{NOMI}$, $GAIN_{NOMQ}$, $IN_I$ is the sum of the voltages across the in-phase common ground lead $L_{CGI}$, the driver emitter lead $L_{DE}$, the transistor AC base-to-emitter resistance $R_{in}$, and the in-phase gain resistor $R_{SI}$. The current through the in-phase common ground lead $L_{CGI}$ is the common ground current $i_{CGI}$ and is shown in EQ. 3. The current through the driver emitter lead $L_{DE}$ is the driver emitter current $i_{DE}$, which is $(1+\beta)i_{INI}$. The current through the transistor AC base-to-emitter resistance $R_{in}$ and the in-phase gain resistor $R_{SI}$ is the in-phase input current $i_{INI}$; therefore:

$$IN_I = [(1-\beta^2)i_{INI}]j\omega\frac{Le}{4} + \qquad \text{EQ. 15}$$
$$[(1+\beta)i_{INI}]j\omega\frac{Le}{2} + [R_{in}]i_{INI} + [R_{si}]i_{INI}$$

$IN_Q$ is the sum of the voltages across the quadrature-phase common ground lead $L_{CGQ}$, the driver emitter lead $L_{DE}$, the transistor AC base-to-emitter resistance $R_{in}$, and the quadrature-phase gain resistor $R_{SQ}$. The current through the quadrature-phase common ground lead $L_{CGQ}$ is the quadrature-phase common ground current $i_{CGQ}$ and is shown in EQ. 13. The current through the driver emitter lead $L_{DE}$ is the driver emitter current $i_{DE}$, which is $(1+\beta)ji_{INI}$. The current through the transistor AC base-to-emitter resistance $R_{in}$ and the quadrature-phase gain resistor $R_{SQ}$ is the quadrature-phase input current $ji_{INI}$; therefore:

$$IN_Q = [j(1-\beta^2)i_{INI}]j\omega\frac{Le}{4} + \qquad \text{EQ. 16}$$
$$[(1+\beta)ji_{INI}]j\omega\frac{Le}{2} + [R_{in}]ji_{INI} + [R_{sq}]ji_{INI}$$

Simplifying EQ. 15 and EQ. 16, $$IN_I = i_{INI}\left[(1-\beta^2)j\omega\frac{Le}{4} + (1+\beta)j\omega\frac{Le}{2} + R_{in} + R_{si}\right] \qquad \text{EQ. 17}$$

$$IN_Q = ji_{INI}\left[(1-\beta^2)j\omega\frac{Le}{4} + (1+\beta)j\omega\frac{Le}{2} + R_{in} + R_{sq}\right] \qquad \text{EQ. 18}$$

The nominal voltage gains $GAIN_{NOMI}$, $GAIN_{NOMQ}$ are calculated as follows:

From EQ. 2 and EQ. 7:

$$GAIN_{NOMI} = OUT_I / IN_I \qquad \text{EQ. 19}$$
$$= i_{OUTI}R_{li} \Big/ i_{INI}\Big[(1-\beta^2)j\omega\frac{Le}{4} + $$
$$(1+\beta)j\omega\frac{Le}{2} + R_{in} + R_{si}\Big]$$
$$= \beta^2 i_{INI}R_{li} \Big/ i_{INI}\Big[(1-\beta^2)j\omega\frac{Le}{4} + $$
$$(1+\beta)j\omega\frac{Le}{2} + R_{in} + R_{si}\Big]$$
$$= \beta^2 R_{li} \Big/ \Big[(1-\beta^2)j\omega\frac{Le}{4} + $$
$$(1+\beta)j\omega\frac{Le}{2} + R_{in} + R_{si}\Big]$$

Similarly, $$GAIN_{NOMQ} = OUT_Q / IN_Q \qquad \text{EQ. 20}$$
$$= i_{OUTQ}R_{iq} \Big/ i_{INQ}\Big[(1-\beta^2)j\omega\frac{Le}{4} + $$
$$(1+\beta)j\omega\frac{Le}{2} + R_{in} + R_{sq}\Big]$$
$$= j\beta^2 i_{INI}R_{iq} \Big/ ji_{INI}\Big[(1-\beta^2)j\omega\frac{Le}{4} + $$
$$(1+\beta)j\omega\frac{Le}{2} + R_{in} + R_{sq}\Big]$$
$$= \beta^2 R_{iq} \Big/ \Big[(1-\beta^2)j\omega\frac{Le}{4} + $$
$$(1+\beta)j\omega\frac{Le}{2} + R_{in} + R_{sq}\Big]$$

If the load resistors $R_{LI}$, $R_{LQ}$ are equal in value, then $R_{li}$ is equal to $R_{iq}$, and if the gain resistors $R_{SI}$, $R_{SQ}$ are equal in value, then $R_{si}$ is equal to $R_{sq}$, which means the nominal voltage gains $GAIN_{NOMI}$, $GAIN_{NOMQ}$ are equal.

The operating voltage gains are determined by actual circuit operation and include the effects that one amplifier leg would have on the gain of the other amplifier leg due to mutual coupling between the amplifier legs. To determine the operating voltage gains $GAIN_{OPI}$, $GAIN_{OPQ}$, $IN_I$ is the sum of the voltages across the common ground lead $L_{CG}$, the driver emitter lead $L_{DE}$, the transistor AC base-to-emitter resistance $R_{in}$, and the in-phase gain resistor $R_{SI}$. The current through the common ground lead $L_{CG}$ is the common ground current $i_{CG}$ and is shown in EQ. 14. The current through the driver emitter lead $L_{DE}$ is the driver emitter current $i_{DE}$, which is $(1+\beta)i_{INI}$. The current through the transistor AC base-to-emitter resistance $R_{in}$ and the in-phase gain resistor $R_{SI}$ is the in-phase input current $i_{INI}$; therefore:

$$IN_I = [(1+j)(1-\beta^2)i_{INI}]j\omega\frac{Le}{8} + \qquad \text{EQ. 21}$$
$$[(1+\beta)i_{INI}]j\omega\frac{Le}{2} + [R_{in}]i_{INI} + [R_{si}]i_{INI}$$

Similarly, for $IN_Q$:

$$IN_Q = [(1+j)(1-\beta^2)i_{INI}]j\omega\frac{Le}{8} +$$

$$[(1+\beta)ji_{INI}]j\omega\frac{Le}{2} + [R_{in}]ji_{INI} + [R_{sq}]ji_{INI}$$

EQ. 22

Simplifying EQ. 21 and EQ. 22, $$IN_I = i_{INI}\left[(j-1)(1-\beta^2)\omega\frac{Le}{8} + j(1+\beta)\omega\frac{Le}{2} + R_{in} + R_{si}\right]$$

EQ. 23

$$IN_Q = ji_{INI}\left[(1+j)(1-\beta^2)\omega\frac{Le}{8} + j(1+\beta)\omega\frac{Le}{2} + R_{in} + R_{sq}\right]$$

EQ. 24

The operating voltage gains $GAIN_{OPI}$, $GAIN_{OPQ}$ can be calculated by combining EQ. 23, EQ. 24, EQ. 2, and EQ. 7:

$$GAIN_{OPI} = OUT_I/IN_I$$

EQ. 25

$$= i_{OUTI}R_{li}\bigg/i_{INI}\left[(j-1)(1-\beta^2)\omega\frac{Le}{8} + j(1+\beta)\omega\frac{Le}{2} + R_{in} + R_{si}\right]$$

$$= \beta^2 i_{INI} R_{li}\bigg/i_{INI}\left[(j-1)(1-\beta^2)\omega\frac{Le}{8} + j(1+\beta)\omega\frac{Le}{2} + R_{in} + R_{si}\right]$$

$$= \beta^2 R_{li}\bigg/\left[(j-1)(1-\beta^2)\omega\frac{Le}{8} + j(1+\beta)\omega\frac{Le}{2} + R_{in} + R_{si}\right]$$

Similarly:

$$GAIN_{OPQ} = OUT_Q/IN_Q$$

EQ. 26

$$= \beta^2 R_{lq}\bigg/\left[(1+j)(1-\beta^2)\omega\frac{Le}{8} + j(1+\beta)\omega\frac{Le}{2} + R_{in} + R_{sq}\right]$$

From the above, if the load resistors $R_{LI}$, $R_{LQ}$ are equal in value and the gain resistors $R_{SI}$, $R_{SQ}$ are equal in value, for the operating voltage gains $GAIN_{OPI}$, $GAIN_{OPQ}$ to also be equal, then $$(1-\beta^2)\omega\frac{Le}{8}$$

must be equal to $$-(1-\beta^2)\omega\frac{Le}{8},$$

which can only occur if the inductance $$\frac{Le}{8}$$

of the common ground lead $L_{CG}$ is zero. Therefore, the only other way to make the operating voltage gains $GAIN_{OPI}$, $GAIN_{OPQ}$ equal is to make either the load resistors $R_{LI}$, $R_{LQ}$ unequal, or the gain resistors $R_{SI}$, $R_{SQ}$ unequal, or both, which makes the nominal voltage gains $GAIN_{NOMI}$, $GAIN_{NOMQ}$ unequal. In an exemplary embodiment of the present invention, the load resistors $R_{LI}$, $R_{LQ}$ are equal in value, $R_{sq}$ is equal to $$2(\beta^2-1)\omega\frac{Le}{8},$$

and $R_{si}$ is equal to zero, then the operating voltage gains $GAIN_{OPI}$, $GAIN_{OPQ}$ from EQ. 25 and EQ. 26 become:

$$GAIN_{OPI} = OUT_I/IN_I$$

EQ. 27

$$= \beta^2 R_{li}\bigg/\left[(j-1)(1-\beta^2)\omega\frac{Le}{8} + j(1+\beta)\omega\frac{Le}{2} + R_{in} + 0\right]$$

$$= \beta^2 R_{li}\bigg/\left[(1-j)(\beta^2-1)\omega\frac{Le}{8} + j(1+\beta)\omega\frac{Le}{2} + R_{in}\right]$$

$$GAIN_{OPQ} = OUT_Q/IN_Q$$

EQ. 28

$$= \beta^2 R_{lq}\bigg/\left[(1+j)(1-\beta^2)\omega\frac{Le}{8} + j(1+\beta)\omega\frac{Le}{2} + R_{in} + 2(\beta^2-1)\omega\frac{Le}{8}\right]$$

$$= \beta^2 R_{lq}\bigg/\left[(-1-j)(\beta^2-1)\omega\frac{Le}{8} + j(1+\beta)\omega\frac{Le}{2} + R_{in} + 2(\beta^2-1)\omega\frac{Le}{8}\right]$$

$$= \beta^2 R_{lq}\bigg/\left[(1-j)(\beta^2-1)\omega\frac{Le}{8} + j(1+\beta)\omega\frac{Le}{2} + R_{in}\right]$$

The nominal voltage gains $GAIN_{NOMI}$, $GAIN_{NOMQ}$ from EQ. 19 and EQ. 20 become:

$$GAIN_{NOMI} = OUT_I/IN_I$$

EQ. 29

$$= \beta^2 R_{li}\bigg/\left[(1-\beta^2)j\omega\frac{Le}{4} + (1+\beta)j\omega\frac{Le}{2}R_{in} + R_{si}\right]$$

$$= \beta^2 R_{li}\bigg/\left[(1-\beta^2)j\omega\frac{Le}{4} + \right.$$

-continued $$(1+\beta)j\omega\frac{Le}{2}+R_{in}+0\bigg]$$

$$GAIN_{NOMQ} = OUT_Q/IN_Q \quad \text{EQ. 30}$$

$$=\beta^2 R_{lq}\bigg/\bigg[(1-\beta^2)j\omega\frac{Le}{4}+$$

$$(1+\beta)j\omega\frac{Le}{2}R_{in}+R_{sq}\bigg]$$

$$=\beta^2 R_{lq}\bigg/\bigg[(1-\beta^2)j\omega\frac{Le}{4}+$$

$$(1+\beta)j\omega\frac{Le}{2}+R_{in}+2(\beta^2-1)\omega\frac{Le}{8}\bigg]$$

Unless the inductance $$\frac{Le}{8}$$

of the common ground lead $L_{CG}$ is zero, the nominal voltage gains $GAIN_{NOMI}$, $GAIN_{NOMQ}$ are unequal, and the operating voltage gains $GAIN_{OPI}$, $GAIN_{OPQ}$ are equal. If the quadrature input signals $IN_I$, $IN_Q$ are equal in amplitude and phase-shifted by 90 degrees, then the exemplary embodiment of the present invention provides quadrature output signals $OUT_I$, $OUT_Q$ that are equal in amplitude and phase-shifted by 90 degrees, which is proper operation for a quadrature RF amplifier.

Figure 5:
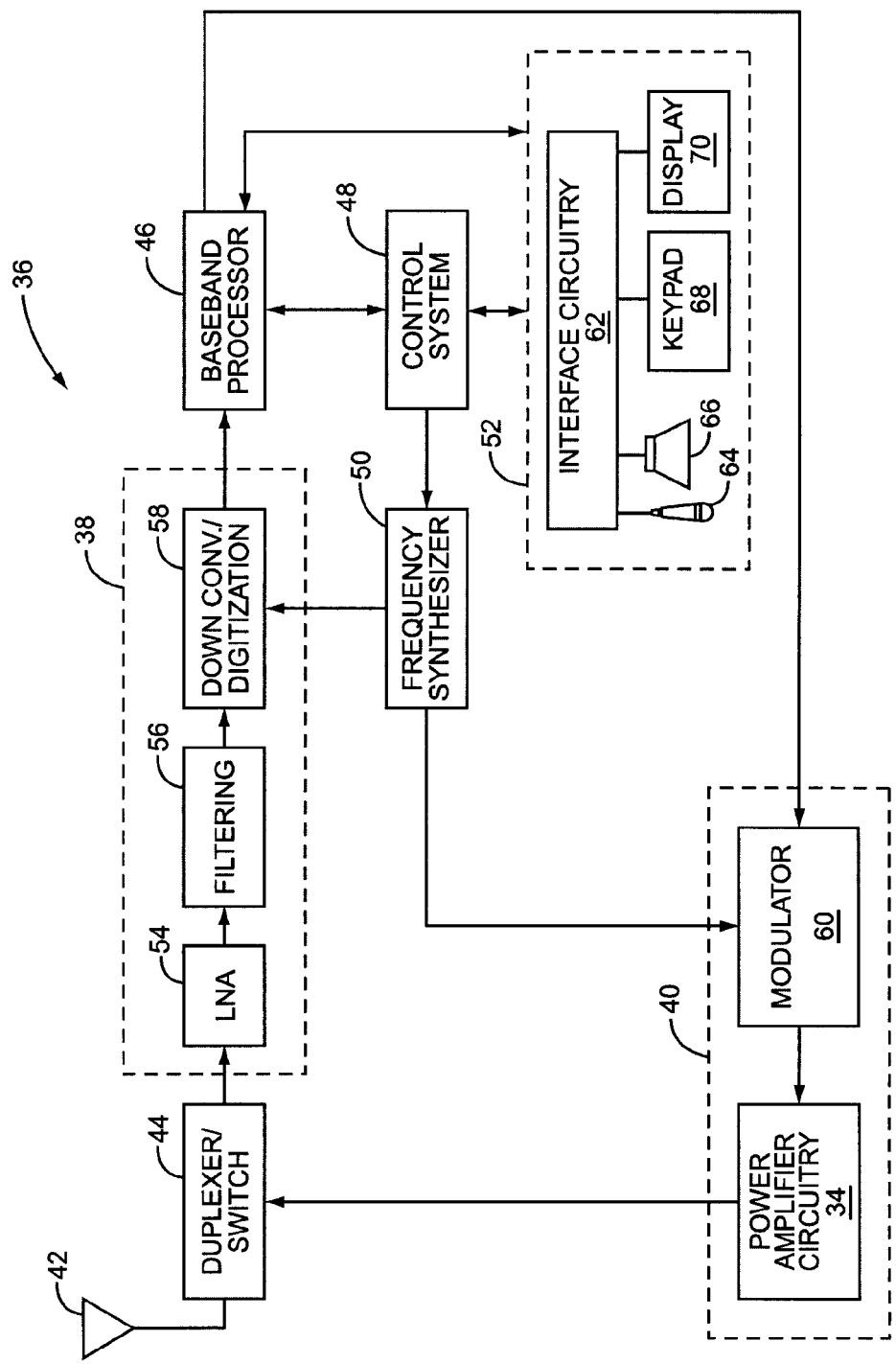
FIG. 5 shows an example of the present invention in a mobile terminal.

An application example of a quadrature RF power amplifier is its use in power amplifier circuitry 34 in a mobile terminal 36. The basic architecture of the mobile terminal 36 is represented in FIG. 5 and may include a receiver front end 38, a radio frequency transmitter section 40, an antenna 42, a duplexer or switch 44, a baseband processor 46, a control system 48, a frequency synthesizer 50, and an interface 52. The receiver front end 38 receives information bearing radio frequency signals from one or more remote transmitters provided by a base station. A low noise amplifier (LNA) 54 amplifies the signal. A filter circuit 56 minimizes broadband interference in the received signal, while downconversion and digitization circuitry 58 downconverts the filtered, received signal to an intermediate or baseband frequency signal, which is then digitized into one or more digital streams. The receiver front end 38 typically uses one or more mixing frequencies generated by the frequency synthesizer 50. The baseband processor 46 processes the digitized received signal to extract the information or data bits conveyed in the received signal. This processing typically comprises demodulation, decoding, and error correction operations. As such, the baseband processor 46 is generally implemented in one or more digital signal processors (DSPs).

On the transmit side, the baseband processor 46 receives digitized data, which may represent voice, data, or control information, from the control system 48, which it encodes for transmission. The encoded data is output to the transmitter 40, where it is used by a modulator 60 to modulate a carrier signal that is at a desired transmit frequency. The power amplifier circuitry 34 amplifies the modulated carrier signal to a level appropriate for transmission, and delivers the amplified and modulated carrier signal to the antenna 42 through the duplexer or switch 44.

A user may interact with the mobile terminal 36 via the interface 52, which may include interface circuitry 62 associated with a microphone 64, a speaker 66, a keypad 68, and a display 70. The interface circuitry 62 typically includes analog-to-digital converters, digital-to-analog converters, amplifiers, and the like. Additionally, it may include a voice encoder/decoder, in which case it may communicate directly with the baseband processor 46. The microphone 64 will typically convert audio input, such as the user's voice, into an electrical signal, which is then digitized and passed directly or indirectly to the baseband processor 46. Audio information encoded in the received signal is recovered by the baseband processor 46, and converted by the interface circuitry 62 into an analog signal suitable for driving the speaker 66. The keypad 68 and display 70 enable the user to interact with the mobile terminal 36, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. A quadrature radio frequency (RF) amplifier circuit comprising:
   an in-phase driver circuit and an in-phase final stage providing an in-phase amplifier circuit having a first nominal gain and a first operating gain; and
   a quadrature-phase driver circuit and a quadrature-phase final stage providing a quadrature-phase amplifier circuit having a second nominal gain and a second operating gain,
   wherein corresponding terminals of the in-phase amplifier circuit and the quadrature-phase amplifier circuit are coupled to a common ground lead, which is inductively coupled to ground, the first nominal gain is substantially unequal to the second nominal gain if a common signal is provided to the in-phase amplifier circuit and the quadrature-phase amplifier circuit, and the first operating gain is substantially equal to the second operating gain when an in-phase input signal is provided to the in-phase amplifier circuit and a quadrature-phase input signal, which is phase shifted approximately 90 degrees from the in-phase input signal, is provided to the quadrature-phase amplifier circuit.

2. The quadrature RF amplifier circuit of claim 1 wherein:
   the in-phase amplifier circuit further comprises in-phase gain setting components, which substantially determine the first nominal gain;
   the quadrature-phase amplifier circuit further comprises quadrature-phase gain setting components, which substantially determine the second nominal gain; and
   a value of at least one of the in-phase gain setting components is substantially unequal to a value of at least one corresponding component of the quadrature-phase gain setting components.

3. The quadrature RF amplifier circuit of claim 1 wherein the in-phase driver circuit further comprises a plurality of in-phase driver stages coupled in series, and the quadrature-phase driver circuit further comprises a plurality of quadrature-phase driver stages coupled in series.

4. The quadrature RF amplifier circuit of claim 1 wherein:
   the in-phase driver circuit has a third nominal gain;
   the quadrature-phase driver circuit has a fourth nominal gain;

the third nominal gain is substantially unequal to the fourth nominal gain;
the in-phase final stage has a fifth nominal gain;
the quadrature-phase final stage has a sixth nominal gain; and
the fifth nominal gain is substantially unequal to the sixth nominal gain.

5. The quadrature RF amplifier circuit of claim 4 wherein:
the in-phase driver circuit further comprises in-phase driver gain-setting components;
the quadrature-phase driver circuit further comprises quadrature-phase driver gain-setting components;
a value of at least one of the in-phase driver gain-setting components is substantially unequal to a value of at least one corresponding component of the quadrature-phase driver gain-setting components;
the in-phase final stage further comprises in-phase final stage gain-setting components;
the quadrature-phase final stage further comprises quadrature-phase final stage gain-setting components; and
a value of at least one of the in-phase final stage gain-setting components is substantially unequal to a value of at least one corresponding component of the quadrature-phase final stage gain-setting components.

6. The quadrature RF amplifier circuit of claim 1 wherein:
the in-phase driver circuit has a third nominal gain;
the quadrature-phase driver circuit has a fourth nominal gain;
the third nominal gain is substantially unequal to the fourth nominal gain;
the in-phase final stage has a fifth nominal gain;
the quadrature-phase final stage has a sixth nominal gain; and
the fifth nominal gain is substantially equal to the sixth nominal gain.

7. The quadrature RF amplifier circuit of claim 6 wherein:
the in-phase driver circuit further comprises in-phase driver gain-setting components;
the quadrature-phase driver circuit further comprises quadrature-phase driver gain-setting components;
a value of at least one of the in-phase driver gain-setting components is substantially unequal to a value of at least one corresponding component of the quadrature-phase driver gain-setting components;
the in-phase final stage further comprises in-phase final stage gain-setting components;
the quadrature-phase final stage further comprises quadrature-phase final stage gain-setting components; and
values of the in-phase final stage gain-setting components are substantially equal to values of corresponding components of the quadrature-phase final stage gain-setting components.

8. The quadrature RF amplifier circuit of claim 1 wherein:
the in-phase driver circuit further comprises:
an in-phase driver input adapted to receive the in-phase input signal;
an in-phase driver output; and
in-phase driver gain-setting components coupled between the in-phase driver input and the in-phase driver output; and
the quadrature-phase driver circuit further comprises:
a quadrature-phase driver input adapted to receive the quadrature-phase input signal;
a quadrature-phase driver output; and
quadrature-phase driver gain-setting components coupled between the quadrature-phase driver input and the quadrature-phase driver output,
wherein a value of at least one of the in-phase driver gain-setting components is substantially unequal to a value of at least one corresponding component of the quadrature-phase driver gain-setting components.

9. The quadrature RF amplifier circuit of claim 8 wherein:
the in-phase driver gain-setting components further comprise an in-phase driver feedback resistor; and
the quadrature-phase driver gain-setting components further comprise a quadrature-phase driver feedback resistor,
wherein a value of the in-phase driver feedback resistor is substantially unequal to a value of the quadrature-phase driver feedback resistor.

10. The quadrature RF amplifier circuit of claim 9 wherein:
the in-phase driver circuit further comprises a single in-phase driver stage; and
the quadrature-phase driver circuit further comprises a single quadrature-phase driver stage.

11. A quadrature radio frequency (RF) amplifier circuit comprising:
an in-phase amplifier circuit having a first nominal gain and a first operating gain; and
a quadrature-phase amplifier circuit having a second nominal gain and a second operating gain,
wherein corresponding terminals of the in-phase amplifier circuit and the quadrature-phase amplifier circuit are coupled to a common ground lead, which is inductively coupled to ground, the first nominal gain is substantially unequal to the second nominal gain if a common signal is provided to the in-phase amplifier circuit and the quadrature-phase amplifier circuit, and the first operating gain is substantially equal to the second operating gain when an in-phase input signal is provided to the in-phase amplifier circuit and a quadrature-phase input signal, which is phase shifted approximately 90 degrees from the in-phase input signal, is provided to the quadrature-phase amplifier circuit.

12. The quadrature RF amplifier circuit of claim 1 wherein the first nominal gain of the in-phase amplifier circuit being unequal to the second nominal gain of the quadrature-phase amplifier circuit compensates for gain imbalances introduced by at least one factor including the common ground lead of the in-phase amplifier circuit and the quadrature-phase amplifier circuit.

13. The quadrature RF amplifier circuit of claim 1 wherein at least one of the first nominal gain of the in-phase amplifier circuit and the second nominal gain of the quadrature-phase amplifier circuit are selected such that the first nominal gain and the second nominal gain are unequal and compensate for gain imbalances introduced by at least one factor including the common ground lead of the in-phase amplifier circuit and the quadrature-phase amplifier circuit.

14. The quadrature RF amplifier circuit of claim 11 wherein the first nominal gain of the in-phase amplifier circuit being unequal to the second nominal gain of the quadrature-phase amplifier circuit compensates for gain imbalances introduced by at least one factor including the common ground lead of the in-phase amplifier circuit and the quadrature-phase amplifier circuit.

15. The quadrature RF amplifier circuit of claim 11 wherein at least one of the first nominal gain of the in-phase amplifier circuit and the second nominal gain of the quadrature-phase amplifier circuit are selected such that the first nominal gain and the second nominal gain are unequal and compensate for gain imbalances introduced by at least one factor including the common ground lead of the in-phase amplifier circuit and the quadrature-phase amplifier circuit.

* * * * *